United States Patent [19]

Levinson

[11] Patent Number: 4,733,175
[45] Date of Patent: Mar. 22, 1988

[54] VARISTOR DEFECT DETECTION BY INCIPIENT HOT SPOT OBSERVATION

[75] Inventor: Lionel M. Levinson, Schenectady, N.Y.

[73] Assignee: General Electric Company, Schenectady, N.Y.

[21] Appl. No.: 813,809

[22] Filed: Dec. 27, 1985

Related U.S. Application Data

[63] Continuation of Ser. No. 616,759, Jun. 4, 1984, abandoned.

[51] Int. Cl.$^4$ ............................................. G01R 31/02
[52] U.S. Cl. ............................ 324/158 R; 324/158 D; 374/124; 374/137
[58] Field of Search ........... 324/158 P, 73 PC, 158 R, 324/158 D, 158 T, 63; 374/124, 4, 5, 137

[56] References Cited

U.S. PATENT DOCUMENTS

| | | | |
|---|---|---|---|
| 3,421,085 | 1/1969 | Erickson et al. | 324/158 R |
| 3,436,651 | 5/1969 | Helms et al. | 324/73 PC |
| 3,504,524 | 4/1970 | Maley | 374/5 |
| 3,745,460 | 7/1973 | Belzer et al. | 324/158 D |
| 3,759,083 | 9/1973 | Erickson et al. | 324/63 |
| 3,889,053 | 6/1975 | Lloyd et al. | 324/158 R |
| 3,991,302 | 11/1976 | Danner | 324/73 PC |
| 4,112,362 | 9/1978 | Hower et al. | 324/158 D |
| 4,301,409 | 11/1981 | Miller et al. | 324/158 D |

FOREIGN PATENT DOCUMENTS

| | | | |
|---|---|---|---|
| 2203550 | 7/1973 | Fed. Rep. of Germany | 324/158 T |
| 0010517 | 1/1980 | Japan | 374/5 |
| 0976363 | 11/1982 | U.S.S.R. | 374/5 |

OTHER PUBLICATIONS

"Thermography Testing of Production PC Boards", by Weight, 11/81, *Testing*, pp. 69–74, by Sperry Univac.
"Liquid Crystals Plot the Hot Spots", by Lavriente, Electronic Design, 9/13/67, pp. 71–79.
"A New Probe System for the Non-Destructive Testing of the Copper in Through-Holes of Printed Circuit Boards", Circuit World, 7/75, vol. 1, #4.
"Measurement of Thermoelectric Materials and Devices", by Harman, Semiconductor Products, 9/63, pp. 13–21.

*Primary Examiner*—Reinhard J. Eisenzopf
*Assistant Examiner*—W. Burns
*Attorney, Agent, or Firm*—R. Ochis; James C. Davis, Jr.; Marvin Snyder

[57] ABSTRACT

Defects in varistors are detected by pulsing a high current through the varistors and shortly thereafter mapping the temperature distribution of a main varistor surface by heat sensitive equipment. The presence of a localized hot spot sufficiently higher in temperature than a reference temperature level in the varistor indicates the presence of a defect. The disclosed technique is especially adapted for detecting defects that manifest themselves as incipient hot spots but which quickly disappear from observation because their heat rapidly disperses into surrounding varistor material.

24 Claims, 5 Drawing Figures

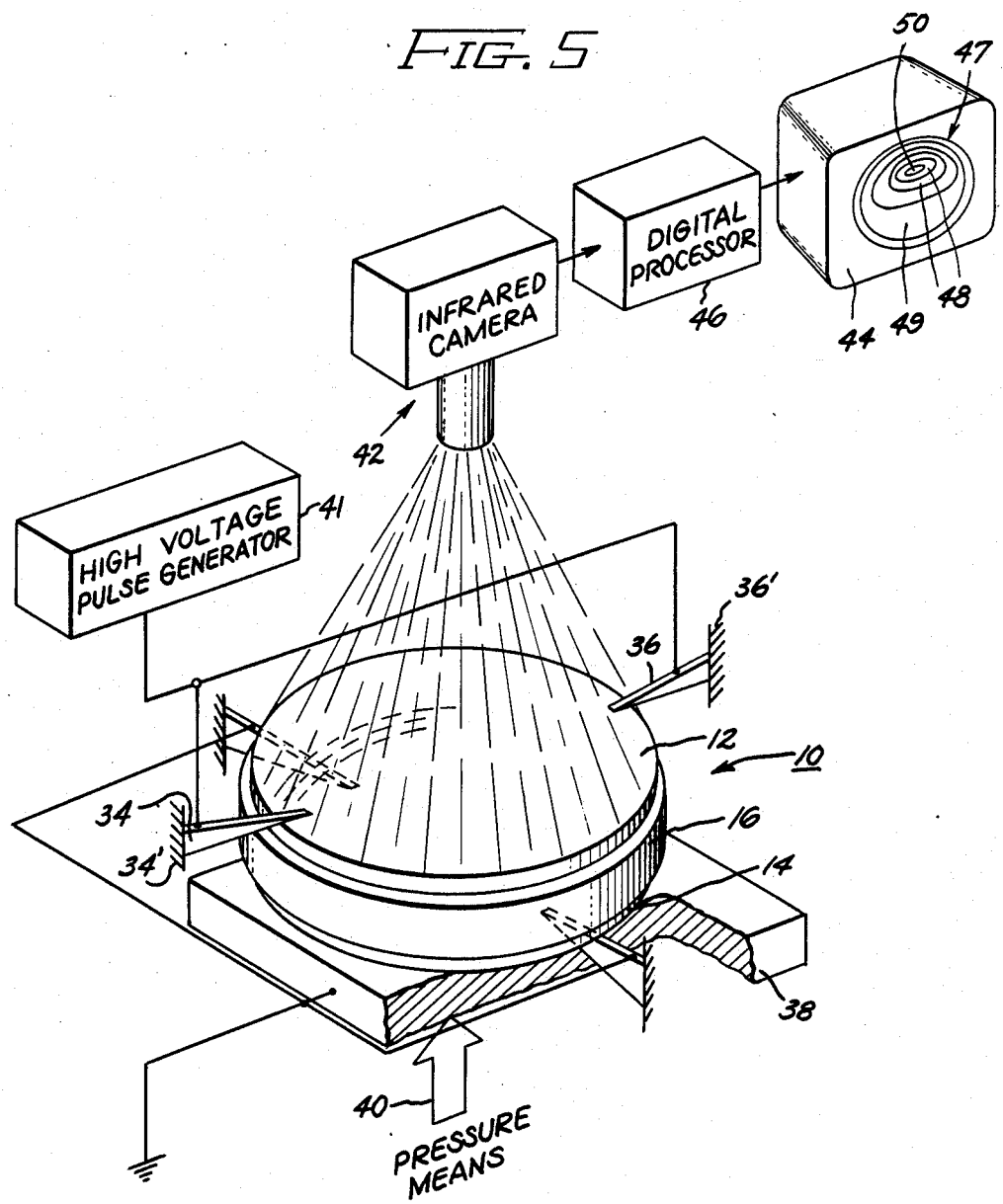

VARISTOR DEFECT DETECTION BY INCIPIENT HOT SPOT OBSERVATION

This application is a continuation of application Ser. No. 616,759, filed June 4, 1984, now abandoned.

BACKGROUND OF THE INVENTION

The present invention relates to a method for locating defects in varistors that are apt to cause device failure, the method involving incipient hot spot observation.

Varistors are used in conjunction with expensive electrical power distribution systems to protect these systems from overvoltages or from surges, that is, extremely brief, extremely high overvoltages, due to a lightning discharge, for example. Varistors typically comprise a ceramic body, such as zinc oxide, together with small amounts of other metal oxide additives, and a pair of opposing electrodes situated on either side of the ceramic body.

Varistors have occasionally failed in operation, particularly when subject to surge conditions, permitting damage to occur to expensive power distribution equipment. Various methods are known for detecting defects in varistors that are likely to cause varistor failure under operating conditions. One known approach, generally, is to estimate the amount of energy a varistor device can absorb, which is simply the maximum attainable product of device voltage, device current, and duration of current flow, without device failure. This approach yields a useful quality control measure of device performance, but is apt to overlook varistor defects that are only fatal to the device during surge conditions.

A second, known approach of detecting defects in varistors, as exemplified by U.S. Pat. No. 4,112,362 to Hower et al., is to form on one side of a varistor ceramic body a temporary electrode structure comprising multiple, discrete electrical contacts and to form a conventional, permanent electrode on another side of the varistor body. A current is pulsed through each contact, one at a time. Varistor current level measurements are made to provide data upon which device performance can be predicted. This approach is inherently limited to a low testing current level since an attempt to pass a high level of current through each discrete contact would result in varistor surface breakdown at the respective edges of the discrete contacts due to high electric fields at such edges. The latter prior art approach, therefore, can only provide an extrapolated estimate of device performance under high current conditions because of inability to simulate such current conditions.

SUMMARY OF THE INVENTION

Accordingly, it is an object of the invention to provide an improved method for detecting defects in varistors that are apt to cause varistor failure under operating conditions.

A further object of the invention is to provide a method for detecting defects in varistors that are fully assembled.

A still further object of the invention is to provide a method for locating failure-causing defects in varistors.

In accordance with a preferred embodiment of the present invention, there is provided a method for locating defects in a varistor that has first and second, uninterrupted electrodes on first and second sides of the varistor, respectively. At least one current pulse is provided through the varistor, the pulse having a current and time duration product that is, preferably, at least as high as the rated current and time duration product of the varistor. Shortly after the current pulse, the temperature distribution on one (or both) of the first and second varistor sides is mapped. The maximum varistor temperature as mapped is compared with a reference temperature level in the varistor. When a sufficient temperature difference exists between the noted temperatures, the presence of a defect is indicated.

BRIEF DESCRIPTION OF THE DRAWINGS

The features of the invention deemed to be novel are defined in the appended claims. The invention itself, however, both as to organization and method of operation, together with further objects and advantages thereof, may be best understood with reference to the following description when read in conjunction with the accompanying drawings, in which:

FIG. 5 is a tridimensional view, partially in schematic form, of a testing arrangement for detection of defects in a varistor according to the present invention.

DETAILED DESCRIPTION OF THE PREFERRED EMBODIMENTS

Figure 1:
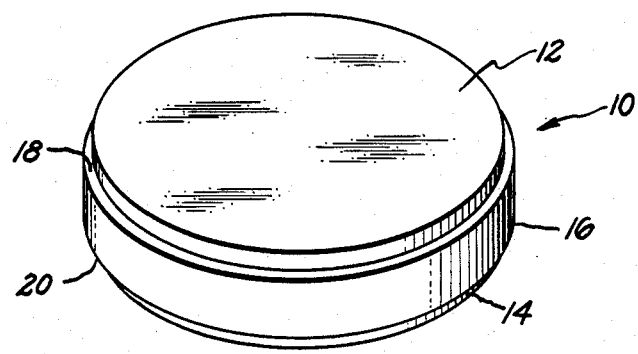
FIG. 1 is a tridimensional view of a typical varistor defects in which can be detected by the method of the present invention.

Varistors that may be tested for defects in accordance with the present invention typically comprise cylindrical disks, as illustrated, for example, by varistor 10 of FIG. 1. Upper and lower varistor electrodes 12 and 14, respectively, are situated on the upper and lower sides, respectively, of a central core 16, which may comprise, for example, a ceramic primarily composed of zinc oxide and also including metal oxide additives.

Electrodes 12 and 14 typically comprise deposited aluminum that, preferably, remains in varistor 10 after testing of the varistor, as described below, for use as permanent electrodes.

Electrodes 12 and 14 are each of slightly less diameter than central portion 16 so as to provide margins 18 and 20, between the lateral peripheries of electrodes 12 and 14, respectively, and the lateral periphery of central portion 16. Margins 18 and 20 are each typically about 50 mils (0.05 inch) wide.

Principal defects that are detectable and locatable by the present method, discussed below, are as follows.

Figure 2:
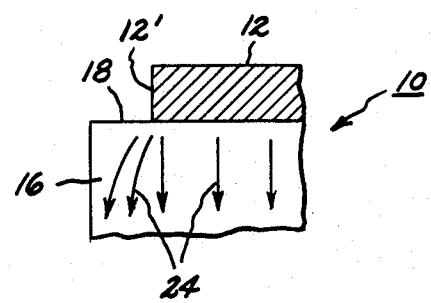
FIG. 2 is an enlarged detail view, in cross-section, of an edge region of the varistor of FIG. 1.
Figure 3:
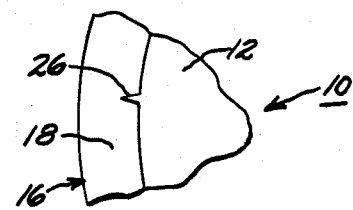
FIG. 3 is an enlarged, detail view, in top plan format, of a portion of the varistor of FIG. 1, depicting a defect in electrode structure.

A primary failure mode in varistors occurs during surge conditions, that is, during a high current condition of short duration, due to high, temporary overvoltages, such as lightning discharges. As illustrated in FIG. 2, a principal location of surge-sensitive varistor defects is in central portion 16 of varistor 10, beneath lateral periphery 12' of electrode 12. In particular, the current level in central portion 16 beneath lateral periphery 12' during a surge condition is significantly higher than the current level more radially inward in central portion 16 (i.e., to the right in FIG. 2), as indicated by bunching of current arrows 24 beneath lateral periphery 12'. The higher concentration of current beneath periphery 12' causes relatively higher local heating in central portion 16 of varistor 10, which may be described as a hot spot. Hot spots are particularly apt to occur beneath an irregularity in lateral periphery 12' of electrode 12. One such irregularity is illustrated in FIG. 3 as a spike-shaped, peripheral discontinuity 26 in electrode 12. The testing method of the present invention is especially well-suited for detecting and locating peripheral electrode irregularities, such as peripheral discontinuity 26 (FIG. 3), that may cause device failure.

The kinds of defects associated with upper electrode 12 (FIG. 1) may also be present in association with lower electrode 16, since electrodes 12 and 14 are generally symmetrical with each other.

Figure 4:
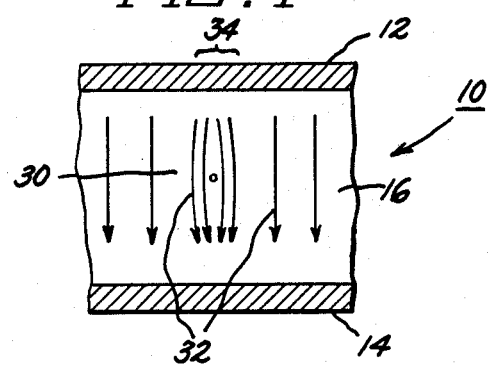
FIG. 4 is an enlarged, fragmentary view, in cross-section, of a portion of the varistor of FIG. 1.

With reference to FIG. 4, another type of defect that can be detected and located by the method of the present invention, described below, is a defect in the microcrystalline structure of varistor central portion 16, such as defect 30. Current directed vertically in central portion 16, as indicated by arrows 32, is at a higher density around defect 30 than in the remainder of central portion 16. Such higher current density causes localized heating in central portion 16, which is observable on an electrode surface, such as at surface 34 of upper electrode 12, at least if electrode 12 is sufficiently thin as to be "transparent" to heat (i.e., having the property of low lateral heat dissipation).

The above-described defects of varistor 10 may result in excessive localized heating in the varistor central portion 16. This is fatal to the varistor if melting of varistor material occurs. For a zinc oxide varistor, such melting commences if the local temperature rises above a few hundred degrees Centigrade. Once melting in varistor 10 has commenced, the varistor quickly overheats in a thermal runaway mode and self-destructs.

In order to detect the above-described defects in varistors, the testing method of the present invention may utilize the testing arrangement of FIG. 5. In general overview, the FIG. 5 arrangement provides for pulsing varistor 10 with electrical current and then mapping the heat distribution on the upper surface of varistor 10.

Electrical pulsing of the varistor is implemented by electrically connecting varistor upper electrode 12 to a standard, high voltage pulse generator 41 via upper electrical contacts 34 and 36, which may be knife-shaped, as shown, and a lower, plate-shaped contact 38 at electrical ground. Upper contacts 34 and 36 are mechanically held stationary, as diagrammatically indicated at 34' and 36', while lower contact 38 is pressed upwards by schematically-illustrated pressure means 40, which may comprise a pneumatic pressure means, for example. Due to the presence of upper knife contacts 34 and 35 small areas in the vicinity of each contact are effectively masked from accurate thermal measurement. However, varistor 10 may be rotated after a thermal test and retested to assure that thermal measurement of the entire upper surface of varistor 10 is performed.

In undergoing the test procedure described herein, the varistor 10 is pulsed at least once at a current level slightly above the rated level, for a short duration. For example, if varistor 10 is rated at 1000 amps for a 2 millisecond duration (essentially, a thermal limitation), then varistor 10 is pulsed at 1200 amps for the same duration.

To map the thermal distribution on the upper surface of varistor 10, heat sensitive means, such as an infrared camera 42, is provided. Camera 42 may comprise an INFRAMETRICS Model 525 camera, by way of example. The mapped, temperature distribution information may be conveniently portrayed on a standard cathode ray tube 44, with formatting of the information from imaging equipment 42 for reception by cathode ray tube 44 being provided by a digital processor 46, comprising, for example, an INTERACTIVE VIDEO SYSTEMS Model 200 digital processor. In particular, digital processor 46 may be programmed to provide on cathode ray tube 44 a thermal depiction 47 of varistor 10 with differently-colored temperature bands 48, 49 and 50 indicating different temperature zones in varistor 10. The innermost circle 50 of thermal depiction 47 represents a maximum temperature. Suitable programming of digital processor 46 is within the purview of those skilled in the art.

When using infrared camera 42 for sensing the temperature of varistor 10, it is desirable to coat upper electrode 12 with a material of uniform emissivity, that is, a material having the property of radiating heat uniformly over its surface area. This is because electrode 12, at least where it comprises a typical aluminum electrode, can have non-uniform emissivity, which may distort the temperature sensed by camera 42. Suitable uniform-emissivity coatings, preferably exhibiting high thermal conductivity, will be apparent to those skilled in the art.

Temperature sensing apparatus 42 preferably has a short response time so as to be able to detect a hot spot in varistor 10 before the heat of such hot spot equilibrates or dissipates in surrounding varistor material after cessation of a current pulse through the device. This is especially true for extremely localized hot spots. Additionally, it is desirable that temperature sensing equipment 42 have high spatial resolution in order to be able to accurately detect hot spots of small diameter.

To operate the testing arrangement of FIG. 5, varistor 10 is pulsed, preferably once, with current from high voltage pulse generator 41. Temperature sensing apparatus 42 then maps the temperature distribution on the upper surface of varistor 10 after an interval as short as desired after cessation of the current pulse; the shorter the interval, the better the defect-detection capability. With digital processor 46 formatting information from temperature sensing apparatus 42 for reception by cathode ray tube 44, as described above, the visual display on the cathode ray tube conveniently represents a thermal mapping 47 of the upper surface of varistor 10.

In particular, thermal mapping 47 indicates a maximum temperature location 50 in varistor 10, with cooler regions 48 and 49 surrounding location 50. A serious defect in varistor 10 is indicated where the temperature of location 50 is at least as high as a predetermined threshold temperature level that is most accurately established from comparison testing of varistors from a common manufacturing batch which contain known or intentional defects. One useful threshold temperature level, albeit approximate in nature, is a temperature of about twice the mean temperature in varistor 10, as depicted, for example, by temperature band 49.

Knowledge of the location of a defect in varistor 10 may be useful for diagnostic analyses of the defect. Such location is readily determined with the testing arrangement of FIG. 5, since the position of the defect location 50 in thermal depiction 47 of varistor 10 corresponds to the position of a defect on the thermally-mapped side of varistor 10.

The defect sensing arrangement of FIG. 5 may be modified, for example, by mapping the temperature distribution on both the upper and lower surfaces of varistor 10. This would require another form of lower testing contact, in lieu of plate electrode 38, that does not mask thermal radiation from the lower surface of varistor 10. A pair of electrodes similar to upper electrodes 34 and 36, arranged orthoganally to the upper electrodes, may be used, by way of example.

The foregoing describes a method of detecting defects in varistors and, particularly, those types of defects in varistors that would be fatal to the varistors under surge conditions. Advantageously, the varistors may be fully assembled prior to testing and, thus, do not require special manufacturing steps for testing. Significantly, the location of a defect may be found by the present method.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What is claimed is:

1. A method for detecting defects in varistors, comprising the steps of:
   (a) providing a varistor having first and second opposed major sides and having first and second uninterrupted electrically and thermally conductive electrodes disposed respectively on and substantially completely covering said first and second sides of said varistor,
   (b) providing only one current pulse through said varistor;
   (c) mapping a temperature distribution across at least one of said first and second electrodes after said current pulse before temperature variations across said at least one electrode induced by said current pulse can equillibrate;
   (d) selecting a threshold temperature level for said varistor indicative of the existence of a defect therein; and
   (e) comparing said mapped temperature distribution to said threshold temperature level and assigning a defect status to said varistor if said mapped temperature distribution includes a temperature at least as high as said treshold temperature.

2. The method of claim 1 wherein the step of selecting said threshold temperature comprises selecting as a threshold temperature a temperature level of about twice a mean temperature of said varistor measured after the step of providing said current pulse has been performed.

3. The method of claim 1 wherein said temperature distribution mapping step comprises sensing a thermal profile of said electrode on one of said first and second varistor sides with infrared imaging equipment.

4. The method of claim 2 further comprising applying a coating with substantially uniform emissivity to said electrode to be thermally mapped prior to such thermal mapping.

5. The method of claim 1 wherein the step of providing said curent pulse comprises providing a current pulse through said varistor with a current level and time duration product at least equal to the current level and time duration product rating of said varistor.

6. The method of claim 1 further comprising providing a visual display apparatus indicia of the mapped temperature distribution.

7. The method of claim 1 wherein the step of mapping the temperature distribution of said varistor comprises mapping a temperature distribution of both said first and second varistor electrodes.

8. The method of claim 1 wherein the step of providing said current pulse comprises providing said pulse through a pair of knife-shaped electrical contacts pressed against said first varistor electrode.

9. A method for detecting defects in varistors, comprising the steps of:
   (a) providing a varistor having first and second uninterrupted electrodes on first and second sides of said varistor, respectively;
   (b) providing only one current pulse through said varistor through first and second pairs of knife-shaped electrodes arranged orthogonally to each other, respectively pressed against said first and second varistor electrodes;
   (c) mapping a temperature distribution of at least one of said first and second varistor sides after said current pulse;
   (d) selecting a threshold temperature level for said varistor indicative of the existence of a defect therein; and
   (e) comapring said mapped temperature distribution to said threshold level and assigning a defect status to said varistor if a maximum of said temperature distribution is at least as high as said threshold temperature.

10. A method for detecting defects in varistors comprising the steps of:
    (a) providing a varistor having first and second opposed major side and having first and second uninterrupted electrically and thermally conductive electrodes disposed respectively on and substantially completely covering said first and second sides of said varistor;
    (b) applying a coating of substantially uniform emissivity to an electrode of said varistor;
    (c) pressing a pair of knife-shaped electric contacts against said first varistor electrode;
    (d) providing only one current pulse through said varistor;
    (e) mapping a temperature distribution across said coated electrode after application of said current pulse before temperature variations across said electrode induced by said current pulse can equillibrate;
    (f) selecting a threshold temperature level for said varistor indicative of the existence of a defect therein; and
    (g) comparing said mapped temperature distribution to said threshold temperature level and assigning a defect status to said varistor if said mapped temperature distribution includes a temperature at least as high as said threshold temperature.

11. The method of claim 10 wherein the step of selecting said threshold temperature comprises selecting as a threshold temperature a temperature level of about twice a mean temperature of said varistor measured after said step of providing said current pulse has been performed.

12. The method of claim 10 wherein said temperature distribution mapping step comprises sensing a thermal profile of said one of said first and second varistor electrodes with infrared imaging equipment.

13. The method of claim 10 wherein the step of providing said current pulse comprises providing a current pulse through said varistor with a current level and time duration product at least equal to current level and time duration product rating of said varistor.

14. The method of claim 10 further comprising providing a visual display apparatus indicia of the mapped temperature distribution.

15. The method of claim 10 wherein the step of mapping the temperature distribution of said varistor comprises mapping the temperature of both said first and second varistor electrodes.

16. The method of claim 10 wherein the step of providing said current pulse comprises providing said pulse through said first and second pairs of knife-shaped electric contacts respectively, pressed against said first and second varistor electrodes arranged orthogonally to each other.

17. A method for detecting defects in varistors comprising the steps of:
 (a) providing a varistor having first and second opposed major sides and having first and second uninterrupted electrically and thermally conductive electrodes disposed respectively on and substantially completely covering said first and second sides of said varistor;
 (b) applying a coating of substantially uniform emissivity to said first varistor electrode;
 (c) pressing a pair of knife-shaped electric contacts against said first varistor electrode;
 (d) providing only one current pulse through said varistor;
 (e) mapping a temperature distribution across said first varistor electrode after said current pulse before temperature variations across said electrode induced by said current pulse can equillibrate;
 (f) selecting a threshold temperature level for said varistor indicative of the existence of a defect therein; and
 (g) comparing the mapped temperature distribution to said threshold temperature level and assigning a defect status to said varistor if said mapped temperature distribution includes a temperature at least as high as said threshold temperature.

18. A method for detecting defects in current conducting devices comprising the steps of:
 (a) providing a current conducting device having first and second opposed major sides and having a first uninterrupted electrically and thermally conductive electrode on and substantially completely covering a first side thereof and a second electrode on a second side thereof;
 (b) providing a current pulse through said current conducting device;
 (c) mapping a temperature distribution across said first electrode after said current pulse before temperature variations across said first electrode induced by said current pulse can equillibrate;
 (d) selecting a threshold temperature level for said current conducting device indicative of the existence of a defect therein; and
 (e) comparing said mapped temperature distribution to said threshold temperature level and assigning a defect status to said current conducting device if said mapped temperature distribution includes a temperature at least as high as said threshold temperature.

19. The method of claim 18 wherein the step of selecting said threshold temperature comprises selecting as a threshold temperature a temperature level of about twice a mean temperature of said current conducting device measured after said step of providing said current pulse has been performed.

20. The method of claim 18 wherein said temperature distribution mapping step comprises sensing a thremal profile of said first and second sides of said current conducting device with infrared imaging equipment.

21. The method of claim 18 wherein the step providing said current pulse comprises providing a current pulse through said current conducting device with a current level and time duration product at least equal to a current level and time duration product rating of said current conducting device.

22. The method of claim 18 further comprising the step of providing a visual display apparatus indicia of the mapped temperature distribution.

23. The method of claim 18 wherein said step of providing a current conducting device includes providing a current conducting device having a second uninterrupted electrode.

24. A method for detecting defects in current conducting devices comprising the steps of:
 (a) providing a current conducting device having a first uninterrupted electrically and thermally conductive electrode on a first side thereof and a second interrupted electrically and thermally conductive electrode on a second side thereof;
 (b) providing only one current pulse through said current conducting device with a current level and time duration product at least equal to a current level and time duration product rating of said current conducting device;
 (c) mapping a temperature distribution of said first electrode after said current pulse before temperature variations across said first electrode induced by said current pulse can equillibrate;
 (d) providing a visual display apparatus indicia of the mapped temperature distribution;
 (e) selecting a threshold temperature level for said current conducting device indicative of the existence of a defect therein; and
 (f) comparing said mapped temperature distribution to said threshold temperature level and assigning a defect status to said current conducting device if said temperature distribution includes a temperature at least as high as said threshold temperature.

* * * * *